(12) United States Patent
Tsukamoto

(10) Patent No.: US 11,835,399 B2
(45) Date of Patent: Dec. 5, 2023

(54) SEMICONDUCTOR INTEGRATED CIRCUIT WITH CONFIGURABLE SETTING BASED ON TEMPERATURE INFORMATION

(71) Applicant: Kioxia Corporation, Tokyo (JP)

(72) Inventor: Takayuki Tsukamoto, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 244 days.

(21) Appl. No.: 17/369,392

(22) Filed: Jul. 7, 2021

(65) Prior Publication Data

US 2022/0228929 A1     Jul. 21, 2022

(30) Foreign Application Priority Data

Jan. 20, 2021   (JP) ................ 2021-007123

(51) Int. Cl.
   *G01K 7/01*       (2006.01)
   *G05F 3/26*       (2006.01)
   (Continued)

(52) U.S. Cl.
   CPC ............. *G01K 7/01* (2013.01); *G05F 3/02* (2013.01); *G05F 3/222* (2013.01); *G05F 3/225* (2013.01);
   (Continued)

(58) Field of Classification Search
   CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262;
   (Continued)

(56) References Cited

U.S. PATENT DOCUMENTS 5,945,871 A  *  8/1999  Kausel ...................... G05F 3/30
                                                           327/539
6,956,727 B1 * 10/2005  Brokaw ............. G01R 19/0023
                                                           361/93.7
(Continued)

FOREIGN PATENT DOCUMENTS

JP       2009-217809 A       9/2009
JP       2011-215129 A       10/2011
WO    WO-2022105890 A1 *   5/2022    ............. G05F 1/567

*Primary Examiner* — Thienvu V Tran
*Assistant Examiner* — Nusrat Quddus
(74) *Attorney, Agent, or Firm* — Foley & Lardner LLP

(57) ABSTRACT

A semiconductor integrated circuit includes a bandgap reference circuit that includes a first bandgap element, a second bandgap element, and a current mirror circuit. The bandgap reference circuit is configured to generate a temperature-dependent first voltage and a temperature-independent reference voltage. The semiconductor integrated circuit includes an analog-to-digital converter configured to convert the first voltage into an output code based on the reference voltage and output the first voltage as temperature information, and a setting control circuit configured to change at least one setting of the bandgap reference circuit based on the temperature information.

17 Claims, 12 Drawing Sheets

(51) Int. Cl.
*G05F 3/30* (2006.01)
*G05F 3/02* (2006.01)
*G05F 3/22* (2006.01)
*G11C 16/04* (2006.01)

(52) U.S. Cl.
CPC ............. *G05F 3/26* (2013.01); *G05F 3/262* (2013.01); *G05F 3/265* (2013.01); *G05F 3/30* (2013.01); *G11C 16/0483* (2013.01)

(58) Field of Classification Search
CPC .......... G05F 3/265; G05F 3/267; G05F 1/463; G05F 1/46; G05F 1/461
See application file for complete search history.

(56) References Cited

U.S. PATENT DOCUMENTS

| | | | |
|---|---|---|---|
| 7,034,569 B1 * | 4/2006 | Balasubramanian | G06F 15/7842 326/38 |
| 7,161,340 B2 * | 1/2007 | Chiu | G05F 3/30 323/907 |
| 8,446,209 B1 * | 5/2013 | Horsky | H03B 5/08 327/513 |
| 8,638,084 B1 * | 1/2014 | Abugharbieh | G05F 3/30 438/11 |
| 9,261,415 B1 * | 2/2016 | Zhang | G05F 3/16 |
| 9,946,279 B1 * | 4/2018 | Dinh | G05F 1/56 |
| 9,977,454 B1 * | 5/2018 | Krishnamoorthy | G05F 3/262 |
| 10,129,399 B1 * | 11/2018 | Roberts | G06F 16/22 |
| 10,224,884 B2 * | 3/2019 | Kamath | H03F 3/4508 |
| 10,429,879 B1 * | 10/2019 | Coimbra | G05F 3/30 |
| 11,251,786 B1 * | 2/2022 | Bonomi | H03M 1/48 |
| 2008/0106322 A1 * | 5/2008 | Jeong | G01K 7/015 327/512 |
| 2008/0144415 A1 * | 6/2008 | Macerola | G01K 7/01 374/163 |
| 2009/0201067 A1 | 8/2009 | Haneda | |
| 2011/0068854 A1 * | 3/2011 | Engl | G05F 3/30 327/512 |
| 2011/0248688 A1 * | 10/2011 | Iacob | G05F 3/30 323/234 |
| 2013/0033305 A1 * | 2/2013 | Fukazawa | G05F 1/567 327/539 |
| 2013/0135032 A1 * | 5/2013 | Horsky | H03B 5/04 327/512 |
| 2013/0187628 A1 * | 7/2013 | Furusawa | G05F 3/30 323/313 |
| 2016/0209854 A1 * | 7/2016 | Yen | G05F 3/267 |
| 2016/0238464 A1 * | 8/2016 | Eberlein | G01K 15/00 |
| 2017/0141778 A1 * | 5/2017 | Fukazawa | H03L 1/04 |
| 2018/0128690 A1 * | 5/2018 | Cho | G01K 7/01 |
| 2018/0149526 A1 | 5/2018 | Abughazaleh et al. | |
| 2018/0314279 A1 * | 11/2018 | Wan | G05F 1/465 |
| 2019/0120698 A1 * | 4/2019 | Kwon | H03M 1/0626 |
| 2020/0401177 A1 * | 12/2020 | Liang | G05F 1/595 |
| 2021/0157348 A1 * | 5/2021 | Murakami | G05F 3/245 |
| 2021/0191438 A1 * | 6/2021 | Phogat | G05F 1/468 |
| 2022/0050488 A1 * | 2/2022 | Randlisek | G05F 3/30 |
| 2022/0100221 A1 * | 3/2022 | Li | G05F 3/267 |

* cited by examiner

SEMICONDUCTOR INTEGRATED CIRCUIT WITH CONFIGURABLE SETTING BASED ON TEMPERATURE INFORMATION

CROSS-REFERENCE TO RELATED APPLICATION(S)

This application is based upon and claims the benefit of priority from Japanese Patent Application No. 2021-007123, filed on Jan. 20, 2021, the entire contents of which are incorporated herein by reference.

FIELD

Embodiments described herein relate generally to a semiconductor integrated circuit.

BACKGROUND

In general, a temperature detection circuit that detects a temperature may use a bandgap reference (BGR) circuit. For example, an analog BGR circuit, together with an analog-to-digital converter (ADC), maybe used in a temperature detection circuit. The analog BGR circuit detects the temperature using a bandgap voltage, outputs a temperature-proportional voltage, generates a reference voltage, and supplies the reference voltage to the ADC. The ADC uses the reference voltage from the analog BGR circuit to convert the temperature-proportional voltage into a digital signal and output the converted digital signal. A power supply voltage VDDA is supplied to the analog BGR and the ADC from a regulator.

However, the temperature detection circuit using the analog BGR circuit typically has a relatively narrow temperature range capable of detecting a high-precision temperature. Further, as the voltage of the temperature detection circuit is lowered, there is a problem that the detection accuracy is lowered and the power supply rejection ratio (PSRR) is likely to be deteriorated.

DETAILED DESCRIPTION

Embodiments provide a semiconductor integrated circuit capable of a high-precision temperature detection and an improvement of the power supply rejection ratio (PSRR) in a wide operating temperature range.

In general, according to one embodiment, the semiconductor integrated circuit includes a bandgap reference circuit that includes a first bandgap element, a second bandgap element, and a current mirror circuit. The bandgap reference circuit is configured to generate a temperature-dependent first voltage and a temperature-independent reference voltage. The semiconductor integrated circuit includes an analog-to-digital converter configured to convert the first voltage into an output code based on the reference voltage and output the first voltage as temperature information, and a setting control circuit configured to change at least one setting of the bandgap reference circuit based on the temperature information.

Hereinafter, embodiments of the present disclosure will be described in detail with reference to the drawings.

First Embodiment

Figure 1:
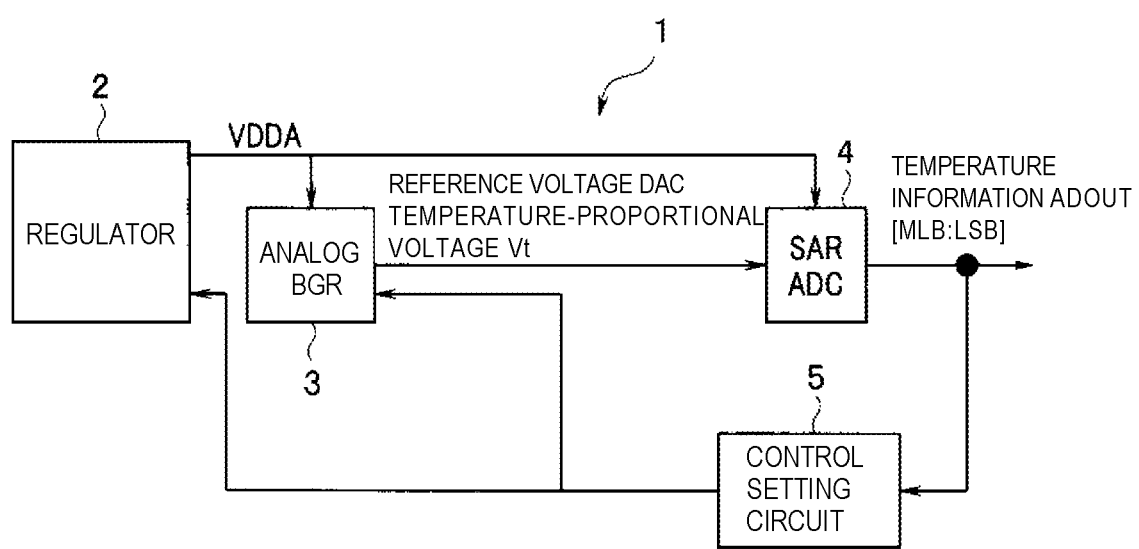
FIG. 1 is a block diagram illustrating a temperature detection circuit constituting a semiconductor integrated circuit according to the present embodiment.
Figure 2:
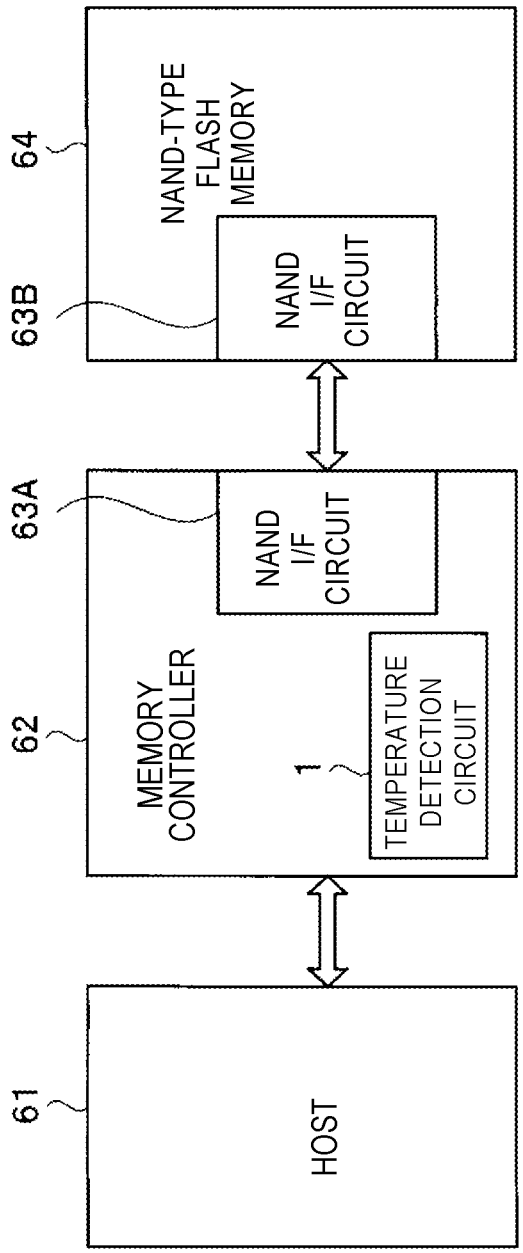
FIG. 2 is a block diagram illustrating a memory system including the temperature detection circuit of FIG. 1.
Figure 3A:
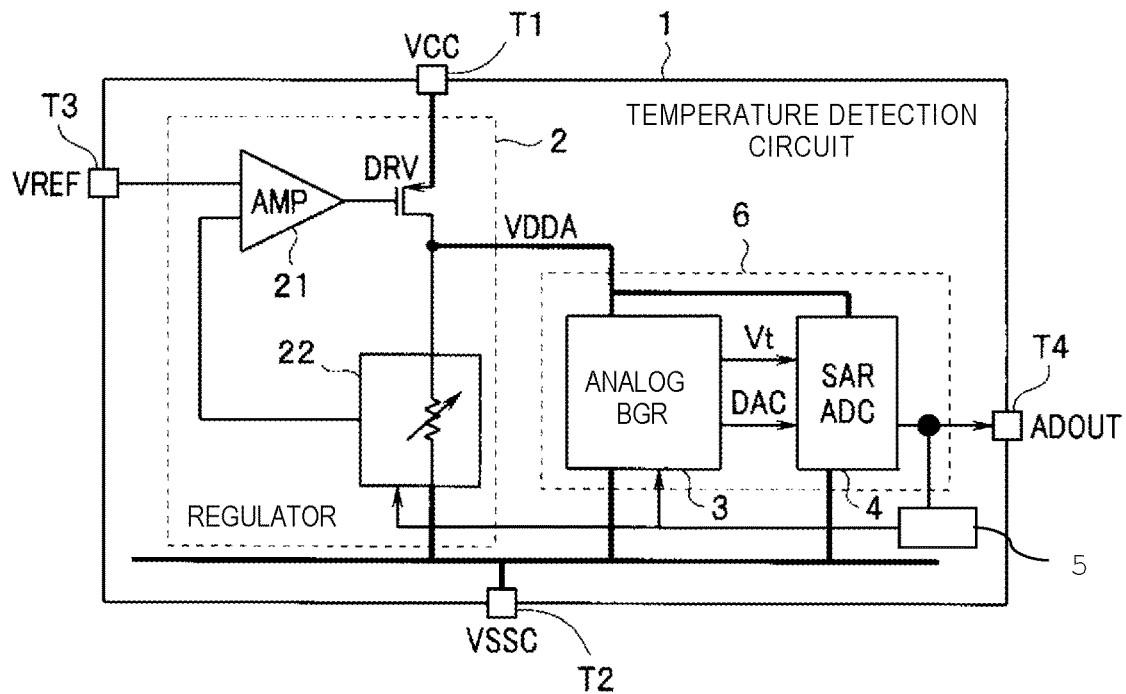
FIG. 3A is a block diagram illustrating an example of the specific configuration of FIG. 1.
Figure 4A:
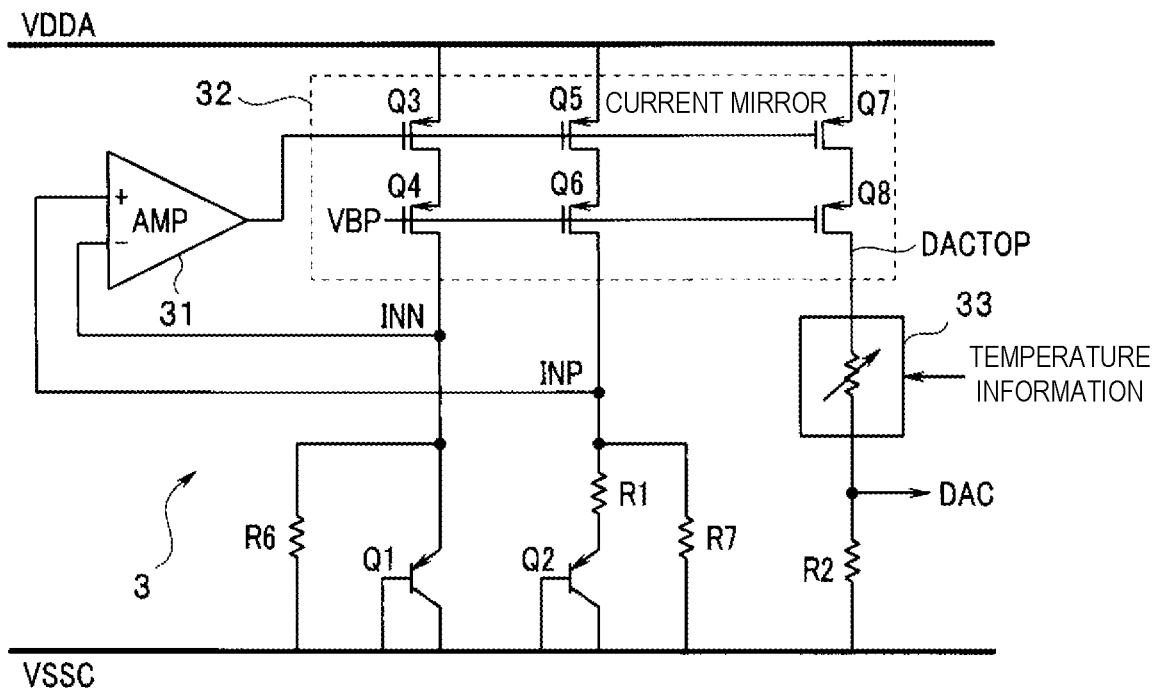
FIG. 4A is a circuit diagram illustrating a specific configuration of an analog BGR circuit in FIG. 3A.

FIG. 1 is a block diagram illustrating a temperature detection circuit constituting a semiconductor integrated circuit according to the present embodiment. FIG. 2 is a block diagram illustrating a memory system including the temperature detection circuit of FIG. 1. Further, FIG. 3A is a block diagram illustrating an example of the specific configuration of FIG. 1. FIG. 4A is a circuit diagram illustrating a specific configuration of an analog BGR circuit in FIG. 3A.

In the present embodiment, by optimizing the setting of the temperature detection circuit according to the detection temperature over a relatively broad operating temperature range, it is possible to detect the temperature with high accuracy and improve the PSRR. Further, the present embodiment may be configured to optimize the setting by utilizing an intermediate result of the temperature detection by the temperature detection circuit, and it is also possible to surely improve the accuracy of the temperature detection.

Although an example of applying the present embodiment to a memory controller that controls a NAND flash memory, which is a non-volatile semiconductor storage device, will be described, the example is applicable to various electronic devices.

In the memory system of FIG. 2, a host 61 and a memory controller 62 are connected via a predetermined interface. For example, as for this interface, various interfaces such as a parallel interface of the embedded multi-media card (eMMC), a serial extension interface of the peripheral component interconnect-express (PCIe), and a high-speed serial interface of M-PHY are adopted. Further, the host 61 and the memory controller 62 have built-in interface circuits that employ these various interfaces.

The memory controller 62 and the NAND-type flash memory 64 have built-in NAND interface (I/F) circuits 63A and 63B, respectively, and are connected to each other via the I/F circuits 63A and 63B. The NAND I/F circuits 63A and 63B employ, for example, a high-speed data transfer mode such as a toggle double data rate (ToggleDDR) and various interfaces such as an open NAND flash interface (ONFI), and transfer data between the memory controller 62 and the NAND-type flash memory 64.

The host 61 generates a write/read request to the memory controller 62. The memory controller 62 controls writing data to the NAND-type flash memory 64 and reading data from the NAND-type flash memory 64 in response to a request from the host.

The memory controller 62 has a temperature detection circuit 1. The temperature detection circuit 1 detects the temperature in the memory controller 62 and outputs the detection result to a central processing unit (CPU) (not illustrated) in the memory controller 62.

The memory controller 62 and the NAND-type flash memory 64 transmit various signals, such as, for example, a signal DQ <7:0> for transmitting and receiving each signal including data, a data strobe signal DQS,/DQS, a chip enable signal CE, a command latch enable signal CLE, an address latch enable signal ALE, a write enable signal/WE, a read enable signal RE,/RE, and a write protect signal WP, via the NAND I/F circuits 63A and 63B.

Further, a temperature detection circuit having the same configuration as the temperature detection circuit 1 in the present embodiment may be built in not only in the memory controller 62 but also in the host 61 and the NAND-type flash memory 64.

Comparative Example

Figure 5:
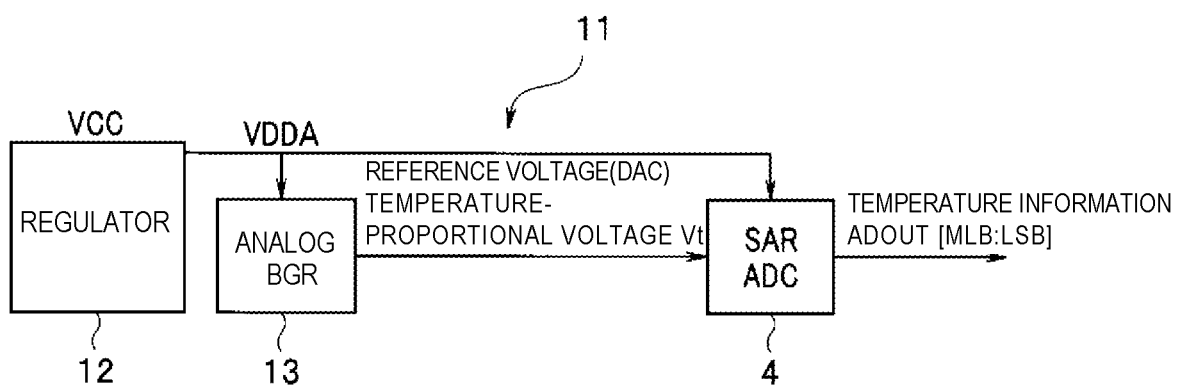
FIG. 5 is a block diagram illustrating a comparative example of a temperature detection circuit.
Figure 6:
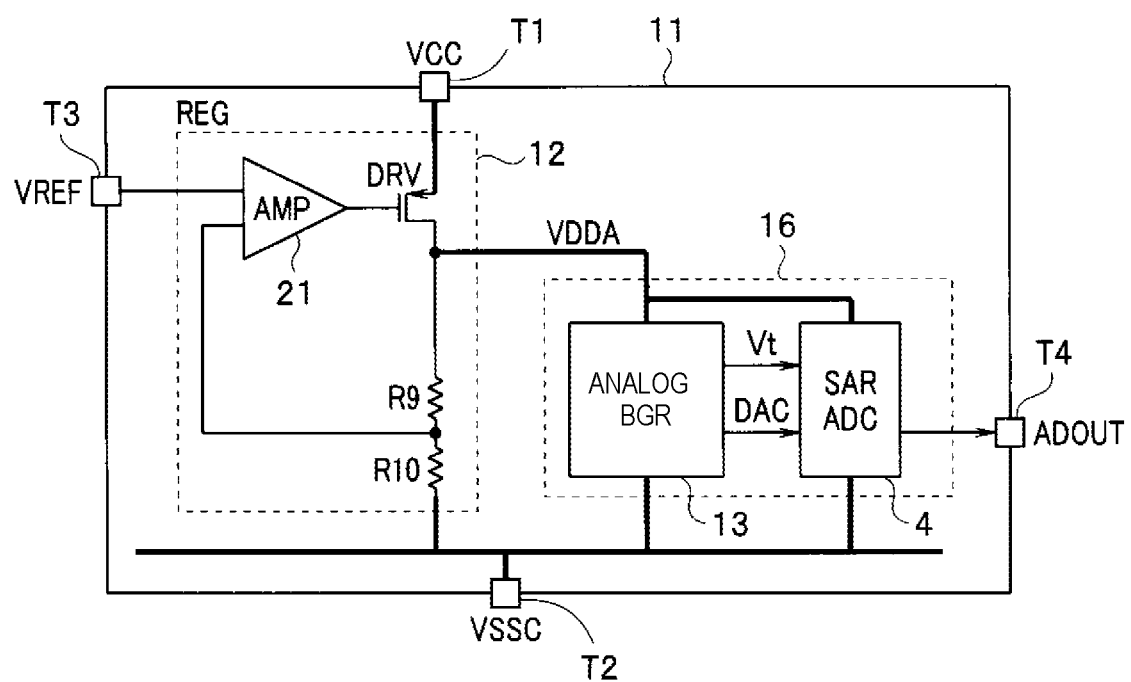
FIG. 6 is a block diagram illustrating an example of the specific configuration of FIG. 5.
Figure 7:
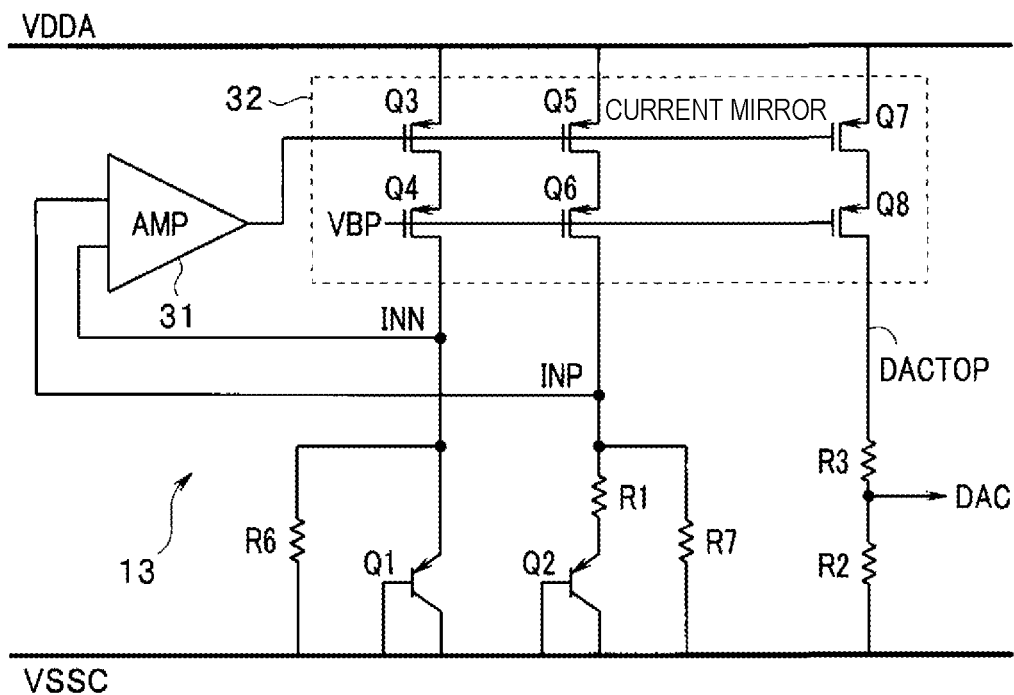
FIG. 7 is a circuit diagram illustrating an example of a specific configuration of an analog BGR circuit in FIG. 6.
Figure 8:
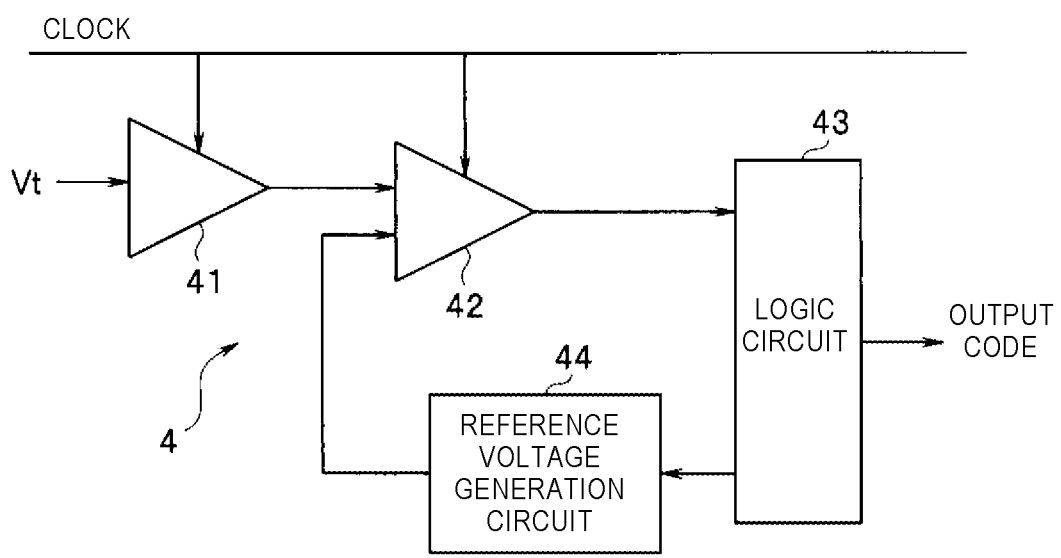
FIG. 8 is a block diagram illustrating an example of a specific configuration of a SARADC in FIG. 6.

FIG. 5 is a block diagram illustrating a comparative example of a temperature detection circuit, and FIG. 6 is a block diagram illustrating an example of the specific configuration of FIG. 5. FIG. 7 is a circuit diagram illustrating an example of a specific configuration of an analog BGR circuit in FIG. 6. FIG. 8 is a block diagram illustrating an example of a specific configuration of a SARADC in FIG. 6. In FIGS. 1, 3A, and 4A representing the first embodiment and FIGS. 5 to 7 representing the comparative example, the same components are designated by the same reference numerals, and duplicate descriptions are omitted for the same components.

The temperature detection circuit 11 illustrated in FIG. 5 includes a regulator 12, an analog BGR circuit 13, and a successive approximation register (SAR)-type AD converter (SARADC) 4. A power supply voltage VCC is supplied to the regulator 12, and the regulator 12 generates a power supply voltage VDDA. This power supply voltage VDDA is supplied to the analog BGR circuit 13 and the SARADC 4.

In FIG. 6, the regulator 12 includes an amplifier (AMP) 21, an output PMOS transistor DRV, and resistors R9 and R10. In the transistor DRV, a source is connected to a power supply terminal T1, the output of the amplifier 21 is applied to a gate, and a drain is connected to one end of the resistor R9. The other end of the resistor R9 is connected to one end of the resistor R10, and the other end of the resistor R10 is connected to a power supply terminal T2. The voltage VCC is supplied to the power supply terminal Ti and a voltage VSSC is supplied to the power supply terminal T2. Further, a set voltage VREF for setting the voltage VDDA is supplied to a control terminal T3.

The transistor DRV generates an output voltage VDDA according to the output of the amplifier 21 in the drain and supplies the generated output voltage VDDA to a BGR sensor unit 16 which is the main body of a temperature sensor. The voltage VDDA appearing in the drain of the transistor DRV is divided by the resistors R9 and R10. A voltage (feedback voltage) according to the voltage VDDA is fed back from the connection point of the resistor R9 and the resistor R10 to a positive electrode input end of the amplifier 21. The set voltage VREF from the control terminal T3 is applied to a negative electrode input end of the amplifier 21. The amplifier 21 gives an output of a level according to a comparison between the set voltage VREF and the feedback voltage to the gate of the transistor DRV. The amplifier 21 operates so as to match the voltage VREF with the feedback voltage. As a result, an output voltage VDDA corresponding to the set voltage VREF is generated in the drain of the transistor DRV.

The BGR sensor unit 16 includes an analog BGR circuit 13 and a SARADC 4. The analog BGR circuit 13 operates under a voltage VDDA, generates a temperature-proportional voltage Vt proportional to the temperature (temperature detection voltage) and a reference voltage which is a voltage independent of the temperature (voltage DAC), and outputs the voltages to the SARADC 4. The SARADC 4 converts the temperature-proportional voltage Vt into a digital signal using the reference voltage DAC. The SARADC 4 outputs the converted digital signal (output code) as temperature information.

In FIG. 7, the analog BGR circuit 13 includes an amplifier 31, a current mirror circuit 32 including transistors Q1 to Q8, and resistors R1 to R3, R6, and R7. A current path for allowing a current to pass from the current mirror circuit 32 to a node INN and a bipolar transistor Q1 is provided between the power supply line to which the voltage VDDA is supplied and the power supply line to which the voltage VSSC is supplied (hereinafter, also referred to as a reference potential point). Further, a current path for allowing a current to pass from the current mirror circuit 32 to a node INP, the resistor R1, and a bipolar transistor Q2 is provided between the power supply line to which the voltage VDDA is supplied and the reference potential point. A first bipolar junction transistor (e.g., a PNP transistor) Q1 and a second bipolar junction transistor (e.g., a PNP transistor) Q2 which are bandgap elements have different emitter regions, and the collector current ratio is set to 1:m. These transistors Q1 and Q2 enable a temperature measurement using a band gap.

The transistors Q3 to Q8 constitute a current mirror circuit 32. The drain/source path of a PMOS transistor Q3 and the drain/source path of a PMOS transistor Q4 are connected in series between the power supply line to which the voltage VDDA is supplied and the node INN, and the emitter/collector path of the PNP transistor Q1 is connected between the node INN and the reference potential point. In the transistor Q1, the emitter is connected to the node INN, and the collector and the base are connected to the reference potential point.

The drain/source path of a PMOS transistor Q5 and the drain/source path of a PMOS transistor Q6 are connected in series between the power supply line and the node INP, and the emitter/collector path of the resistor R1 and the transistor Q2 is connected in series between the node INP and the reference potential point. In the transistor Q2, the emitter is connected to the node INP via the resistor R1, and the collector and the base are connected to the reference potential point.

Further, the drain/source path of a PMOS transistor Q7, the drain/source path of a PMOS transistor Q8, and the resistors R3 and R2 are connected in series between the power supply line and the reference potential point.

In the amplifier 31, the negative input end is connected to the node INN, the positive input end is connected to the node INP, and the output end is connected to the gate of the transistors Q3, Q5, and Q7. A bias voltage VBP is applied to the gates of the transistors Q4, Q6, and Q8.

The resistor R6 is connected in parallel with the emitter/collector path of transistor Q1 between the node INN and the reference potential point, and the resistor R7 is connected in parallel with the emitter/collector path of the transistor Q2 between the node INP and the reference potential point.

Next, in a comparative example, an operation of obtaining the reference voltage DAC and the temperature-proportional voltage Vt will be described. Now, in order to simplify the explanation, a circuit without the resistors R6 and R7 is assumed.

The transistors Q1 and Q2 are both diode connections in which the base and collector are connected to the reference potential point. In this case, assuming that a saturation current determined for each transistor is Is, a forward voltage is VF, and a thermal voltage is VT (=kT/q), the current IF flowing in the emitter/collector path is expressed by the following equation (1). Further, T is the absolute temperature, k is the Boltzmann constant, and q is the amount of charge of the electron.

$$IF=Is(exp(VF/VT)-1)Is(exp(VF/VT)) \quad (1)$$

Therefore, the following equation (2) is obtained.

$$VF=VT \cdot Ln(IF/Is) \quad (2)$$

Here, it is assumed that the current flowing in the emitter/collector path of the node INN and the transistor Q1 is Ia, and the current flowing in the emitter/collector path of the node INP and the transistor Q2 is Ib.

The collector current ratio of the transistors Q1 and Q2 is m. Since the amplifier 31 operates so that a potential difference between the nodes INN and INP becomes 0, the following equation (3) is obtained from the equation (2). It is also assumed that the resistance value of the resistor R1 is R1.

$$VT \cdot Ln(Ia/Is) = VT \cdot Ln\{(Ib/m) \cdot (1/Is)\} + IbR1 \quad (3)$$

When transformed, $Ib = VT/R1 \{Ln(Ia/Is) \cdot (mIs/Ib)\} \quad (4)$

In the current mirror circuit 32, since the current flowing in the emitter/collector path of the transistors Q1 and Q2 and the current flowing in the drain/source path of the transistors Q3 and Q4 are, for example, the same, when Ia=Ib=I, the following equation (5) is obtained.

$$I = VT/R11 \cdot Ln(m) \quad (5)$$

The above equation (5) represents that the current I depends on R1 and VT (i.e., temperature). That is, assuming that there are no resistors R6 and R7, the current I has a characteristic that increases in proportion to the temperature rise and decreases in proportion to the temperature decrease (hereinafter, referred to as a positive temperature characteristic).

Since the current I has a positive temperature characteristic, the voltage generated at both ends of the resistor R1 also has a positive temperature characteristic proportional to the temperature. The voltage generated at both ends of the resistor R1 is output as the temperature-proportional voltage Vt, which is a temperature detection voltage.

In FIG. 7, the node INN is connected to the reference potential point via the resistor R6. Therefore, the sum current of the current flowing through the resistor R6 and the current flowing through the drain/source path of the transistor Q1 flows through the node INN. Similarly, the resistor R7 is connected between the node INP and the reference potential point, and the sum current of the current flowing through the resistor R7 and the current flowing through the drain/source path of the transistor Q2 flows through the node INP.

The current flowing through the resistors R6 and R7 has a characteristic that decreases with a temperature rise and increases with a temperature decrease (hereinafter, referred to as a negative temperature characteristic). Therefore, by appropriately setting the resistance values of the resistors R1, R6, and R7, a current I that does not fluctuate with respect to a temperature change may be passed through the nodes INN and INP.

In the current mirror circuit 32, the same current as the current flowing in the drain/source path of the transistors Q3 and Q4 (the drain/source path of the transistors Q5 and Q6) also flows in the drain/source path of the transistors Q7 and Q8. That is, the current Iout flowing through the drain/source paths of the transistors Q7 and Q8 does not fluctuate with respect to temperature changes. Therefore, the current (mirror current Iout) flowing through the resistors R3 and R2 is constant regardless of the temperature change. The voltage DAC (reference voltage) that appears at the connection point of the resistors R2 and R3 is a current IoutxR2 and is a constant voltage.

Meanwhile, a voltage VBE between the base and the emitter of the transistor Q1 has a negative temperature characteristic. Therefore, the voltages of the nodes INN and INP also have negative temperature characteristics. That is, the voltages of the nodes INN and INP (hereinafter, referred to as a voltage IN) change according to the temperature.

The voltage DAC from the analog BGR circuit 13 is supplied to the SARADC 4 as a reference voltage, and the voltage generated at both ends of the resistor R1 is supplied to the SARADC 4 as a temperature-proportional voltage Vt.

In the example of FIG. 8, the SARADC 4 includes a sample hold circuit 41, a comparison circuit 42, a logic circuit 43, and a reference voltage generation circuit 44. The sample hold circuit 41 samples the input temperature-proportional voltage Vt at the clock timing, holds the voltage Vt, and outputs the voltage Vt to the comparison circuit 42. The comparison circuit 42 compares the temperature-proportional voltage Vt with the reference voltage from the reference voltage generation circuit 44 at the clock timing, and outputs the comparison result to the logic circuit 43. The logic circuit 43 determines the output code based on the comparison result, and controls the reference voltage generation circuit 44 so that the reference voltage based on the comparison result is generated. The reference voltage generation circuit 44 is given a voltage DAC (not illustrated), and is controlled by the logic circuit 43 to generate a reference voltage based on the voltage DAC and output the reference voltage to the comparison circuit 42.

The SARADC 4 obtains the temperature by a relationship between the input reference voltage (voltage DAC) and the temperature-proportional voltage Vt. For example, the SARADC 4 assigns the voltage range to be converted to the code from the most significant bit (MSB) to the least significant bit (LSB). The reference voltage generation circuit 44 of the SARADC 4 uses the voltage DAC to generate a reference voltage having a voltage of ½ of the voltage range to be converted. The reference voltage in this case corresponds to the MSB of the output code. The comparison circuit 42 compares the reference voltage with the input temperature-proportional voltage Vt, and outputs the comparison result to the logic circuit 43. The logic circuit 43 determines the value of the MSB depending on whether the temperature-proportional voltage Vt is larger than the reference voltage. That is, when the temperature-proportional voltage Vt is equal to or higher than the reference voltage, the MSB is set to "1", and when the temperature-proportional voltage Vt is lower than the reference voltage, the MSB is set to "0".

Next, the logic circuit 43 sets the reference voltage corresponding to the lower bit which is one bit lower than the MSB, depending on whether the MSB is "1" or "0". The logic circuit 43 sets, as the reference voltage in this case, a value obtained by adding (when the MSB is "1") or subtracting (when the MSB is "0") a voltage halved from the initially set reference voltage to/from the initially set reference voltage. The reference voltage generation circuit 44 generates this reference voltage and supplies to the reference voltage to the comparison circuit 42. The comparison circuit 42 determines the bit value one bit lower than the MSB by comparing the set reference voltage with the temperature-proportional voltage Vt. After that, the values of the lower bits are sequentially obtained in the same manner, and the code values from the MSB to the LSB are finally determined. The SARADC 4 outputs the obtained output code as temperature information.

Task of Comparative Example

Figure 9:
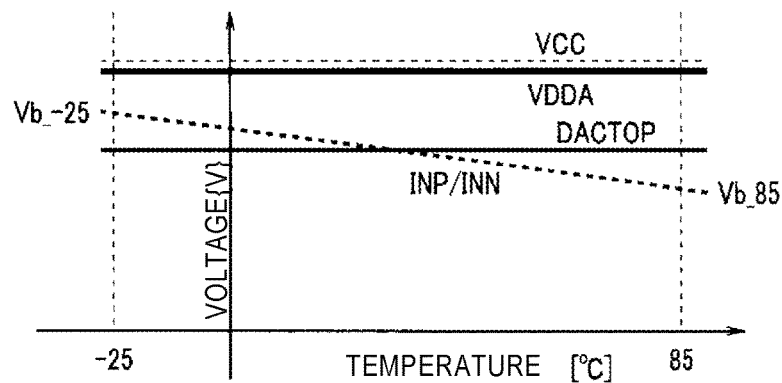
FIG. 9 is a graph illustrating an ideal change in a voltage DACTOP and a temperature-proportional voltage Vt with respect to a temperature change, taking a temperature on the horizontal axis and a voltage on the vertical axis.
Figure 10:
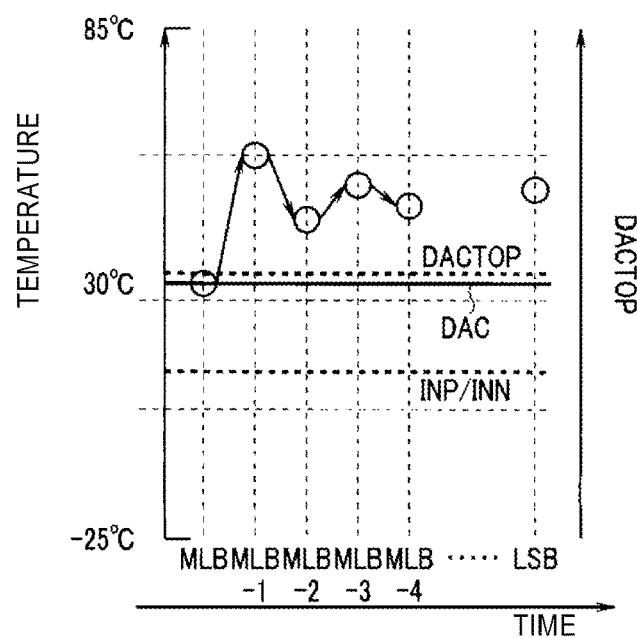
FIG. 10 is a diagram illustrating how to determine an output code by the SARADC 4, taking each bit of the output code on the horizontal axis and the temperature on the vertical axis.

Next, the task in the comparative example will be described with reference to FIGS. 9 and 10. FIG. 9 is a graph illustrating an ideal change in a voltage DACTOP with respect to a temperature change, taking a temperature on the horizontal axis and a voltage on the vertical axis. The voltage DACTOP is the voltage at the connection point between the drain of the transistor Q8 and the resistor R3, and corresponds to the sum voltage of the drain-source voltage VDS of the transistors Q7 and Q8. Further, FIG. 10 is a diagram illustrating how to determine an output code by the SARADC 4, taking each bit of the output code on the horizontal axis and the temperature on the vertical axis.

Task

The voltage DACTOP is a voltage that is higher by the voltage drop due to the mirror current Iout flowing through the resistor R3 with respect to the voltage DAC. When the mirror current Iout is constant regardless of the temperature change, the voltage DACTOP and the voltage DAC become constant regardless of the temperature change. As a condition that the mirror current Iout matches the current I flowing through the nodes INN and INP, it is necessary to make the gate voltages of Q3 to Q7 equal to each other and make the gate voltages of Q4 to Q8 equal to each other, and it is also necessary to match the sum voltage VDS1 of the drain-source voltages of the transistors Q3 and Q4, the sum voltage VDS2 of the drain-source voltages of the transistors Q5 and Q6, and the sum voltage VDS3 (voltage DACTOP) of the drain-source voltages of the transistors Q7 and Q8 with each other. That is, when the voltage DACTOP is equal to the voltage IN, the voltage DAC becomes a constant voltage regardless of the temperature change.

FIG. 9 represents a relationship among the voltage DACTOP (solid line), the voltage IN (broken line), and the temperature. As described above, the base-emitter voltage VBE has a negative temperature characteristic, and the voltage IN changes according to the temperature as illustrated in FIG. 9. Further, the INN node and the INP node have the same potential, and the voltages VDS1 and VDS2 are the same as each other.

Since the voltage DACTOP does not depend on the temperature, a voltage difference occurs between the voltage DACTOP and the voltage VDS1 (VDS2) due to the temperature change. When a voltage difference occurs between the voltage DACTOP and the voltage VDS1 (VDS2), the mirror current Iout changes with respect to the current flowing through the node INN (INP) by the difference. Then, the voltage DAC, which is a reference for determining the output code, also changes according to the temperature, and an error occurs in the output code of the SARADC 4 in the subsequent stage.

Further, the voltage VDDA supplied to the analog BGR circuit 13 is created by the regulator 12, but since the power supply voltage VCC of the regulator 12 is lowered, the voltage VDDA is also lowered. Since the base-emitter voltage VBE of the transistors Q1 and Q2 has a specified value and the voltage VDS1 (VDS2) is VDDA-VBE, the voltage VDS1 (VDS2) and the voltage DACTOP are relatively low voltages. In this case, even when the difference (fluctuation) between the voltage VDS1 (VDS2) and the voltage DACTOP is small, the mirror current fluctuates relatively greatly. That is, when the voltage VDDA is lowered, VDS1, VDS2, and DATCOP become relatively small values in the analog BGR circuit 13, and the mirror current Tout fluctuates relatively greatly due to the difference between VDS1 (VDS2) and DACTOP caused by the temperature change. As a result, the reference voltage DAC also fluctuates relatively greatly, and the accuracy of the temperature information from the SARADC 4 deteriorates.

FIG. 10 illustrates the operation of the SARADC 4 in which the voltage DAC is set as a reference voltage corresponding to an intermediate temperature in the operating temperature range of −25° C. to 85° C. and the bits are sequentially determined from the MSB to the LSB. The example of FIG. 10 is an example in which MSB "1" is obtained by a first determination of the SARADC 4. In a second determination, the SARADC 4 sets the reference voltage to DAC+DAC/2 and obtains the bit value of MLB-1. Further, the SARADC 4 sets the reference voltage to DAC+DAC/2−DAC/4 in a third determination and obtains the bit value of MLB-2. After that, the lower bits are sequentially obtained in the same manner.

FIG. 10 represents a period during which the temperature is measured at a certain temperature. Although the voltage DAC does not fluctuate within this period, as described above, the voltage DACTOP and the voltage DAC fluctuate as a result of the fluctuation of the mirror current Iout due to the temperature change. In the example of FIG. 10, the voltage DACTOP is a voltage different from the voltage IN, and the voltage DAC is a voltage different from the specified voltage value that needs to be originally set. As a result, the SARADC 4 determines each bit using a reference voltage different from the reference voltage that needs to be originally set. In particular, for the bits on the LSB side, the logic of the bit value may change due to fluctuations in the reference voltage, which lowers the accuracy of the output code.

Further, the base-emitter voltage VBE has a negative temperature characteristic as described above. In the example of FIG. 9, it is represented that the base-emitter voltage VBE becomes the largest value at the lowest operating temperature of −25° C. Therefore, at this lowest operating temperature, VDS1 (VDS2) becomes the smallest value. That is, at the lowest operating temperature, the accuracy of temperature detection is the lowest. From the point of view of this detection accuracy, the smallest value of VDS1 (VDS2) is limited, and VDS1 (VDS2) is set to a value equal to or higher than a predetermined value. As a result, the voltage VDDA also needs to be set to a voltage equal to or higher than a predetermined voltage. Since the voltage VCC supplied to the regulator 12 is a specified low voltage, the difference between the voltage VCC and the voltage VDDA is the smallest at the lowest operating temperature at which the base-emitter voltage VBE is the largest. Therefore, at the lowest operating temperature, the drain-source voltage VDS of the transistor DRV of the regulator 12 becomes the smallest, and the PSRR (power supply voltage fluctuation elimination ratio) deteriorates.

That is, as long as the analog BGR circuit is used, it is difficult to sufficiently lower the lowest operating temperature from the viewpoint of temperature detection accuracy and PSRR.

Configuration

In the present embodiment, a control is performed to match VDS1, VDS2, and VDS3 with each other (to match the voltage DACTOP with the voltage IN) so that an accurate mirror current Iout may be obtained. This makes it possible to set the voltage DAC to the specified voltage that needs to be originally set in the entire temperature range, and enables a highly accurate temperature detection.

The temperature detection circuit 1 in FIG. 1 is different from the temperature detection circuit in FIG. 5 in that the regulator 2 is adopted instead of the regulator 12, the analog BGR circuit 3 is adopted instead of the analog BGR circuit 13, and the setting control circuit 5 is provided. The setting control circuit 5 may be implemented by a processor including a central processing unit (CPU), may operate according to a program stored in a memory (not illustrated) to control each part, or may implement a part or all of the functions as a hardware electronic circuit. Further, the function of the setting control circuit 5 may be implemented by the logic circuit 43 in the SARADC 4. The setting control circuit 5 controls the settings of the regulator 2 and the BGR circuit 3 based on the temperature information.

Figure 3B:
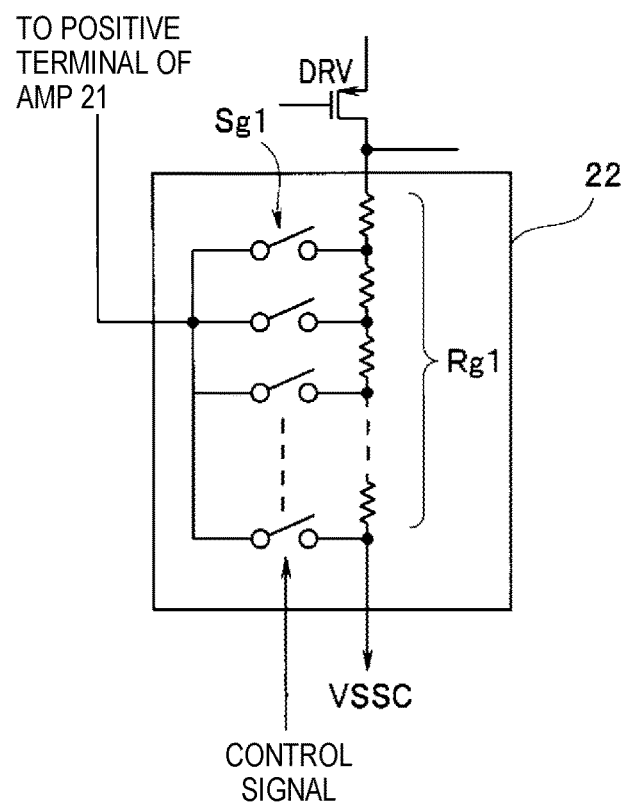
FIG. 3B is a circuit diagram illustrating an example of a specific configuration of a resistance circuit 22 in FIG. 3A.
Figure 4B:
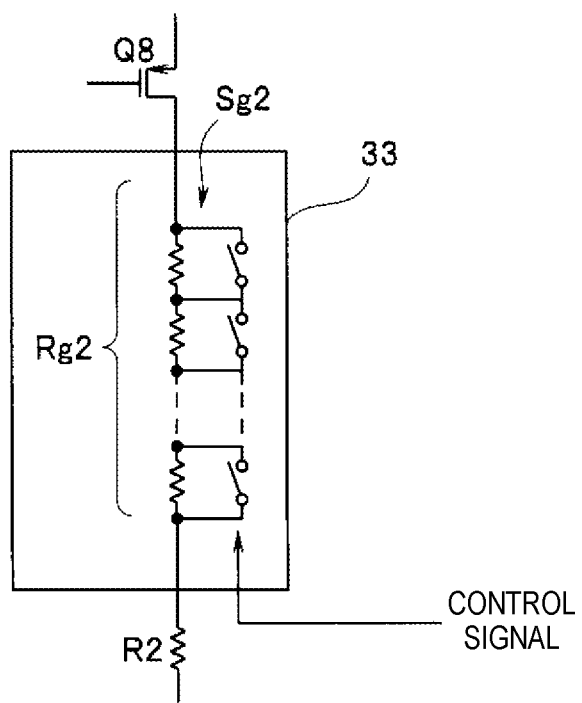
FIG. 4B is a circuit diagram illustrating an example of a specific configuration of a resistance circuit 33 in FIG. 4A.

FIG. 3A illustrates an example of a specific configuration of the temperature detection circuit 1 of FIG. 2, and FIG. 3B is a circuit diagram illustrating an example of a specific configuration of the resistance circuit 22 in FIG. 3A. Further, FIG. 4A is a circuit diagram illustrating an example of a specific configuration of the analog BGR circuit 3 in FIG. 3A, and FIG. 4B is a circuit diagram illustrating an example of a specific configuration of the resistance circuit 33 in FIG. 4A.

As illustrated in FIG. 3A, the temperature detection circuit 1 includes a regulator 2 and a BGR sensor unit 6. The regulator 2 is different from the regulator 12 in FIG. 6 in that a resistance circuit 22 is added instead of the resistors R9 and R10. A control signal from the setting control circuit 5 is given to the resistance circuit 22. The setting control circuit 5 may control the setting of the resistance circuit 22 of the regulator 2 based on the temperature information.

The resistance circuit 22 is provided on a signal path between the drain of the transistor DRV and the reference potential point. The resistance circuit 22 divides the voltage VDDA and applies the voltage VDDA to the positive electrode terminal of the amplifier 21.

As illustrated in FIG. 3A, the resistance circuit 22 may be configured with, for example, a resistance group Rg1 including plural resistors connected in series between the drain of the transistor DRV and the reference potential point, and a switch group Sg1 including plural switches connected between the end of each resistor and the positive electrode terminal of the amplifier 21. The continuity of each switch of the switch group Sg1 is controlled by the control signal of the setting control circuit 5. The setting control circuit 5 may set the voltage VDDA to a voltage according to the temperature information by selecting and conducting one of the switches of the resistance circuit 22 according to the temperature information.

As illustrated in FIG. 4A, the BGR sensor unit 6 is different from that of FIG. 6 in that the analog BGR circuit 3 is adopted instead of the analog BGR circuit 13. The analog BGR circuit 3 is different from the analog BGR circuit 13 of FIG. 7 in that a resistance circuit 33 is added instead of the resistor R3. The resistance circuit 33 is provided on a current path between the drain of the transistor Q8 and the resistor R2. A control signal from the setting control circuit 5 is supplied to the resistance circuit 33. The resistance circuit 33 is configured so that the resistance value of the current path may be changed based on the control signal from the setting control circuit 5.

As illustrated in FIG. 4B, for example, the resistance circuit 33 may be configured with a resistance group Rg2 including plural resistors connected in series on a signal path between the drain of the transistor Q8 and the resistor R2, and a switch group Sg2 including plural switches that bypass each resistor and may be connected to a signal path. The continuity of each switch of the switch group Sg2 is controlled by the control signal of the setting control circuit 5. The setting control circuit 5 controls the on/off of each switch of the switch group Sg2 based on the temperature information, thereby changing the resistance value of the entire resistance circuit 33 on the current path between the drain of the transistor Q8 and the resistor R2, according to the temperature information. The resistance circuit 33 generates a voltage according to the current flowing through the resistance circuit 33, that is, the mirror current Iout and the resistance value of the resistance circuit 33.

In the present embodiment, the voltage DACTOP is the sum of the voltage (voltage DAC) generated by the mirror current Iout flowing through the resistor R2 and the voltage generated by the mirror current Iout flowing through the resistance circuit 33. The mirror current Iout is constant regardless of changes in temperature. Therefore, the voltage DAC is a constant voltage regardless of the temperature. Meanwhile, the voltage DACTOP changes according to the temperature information.

Operation

Figure 11:
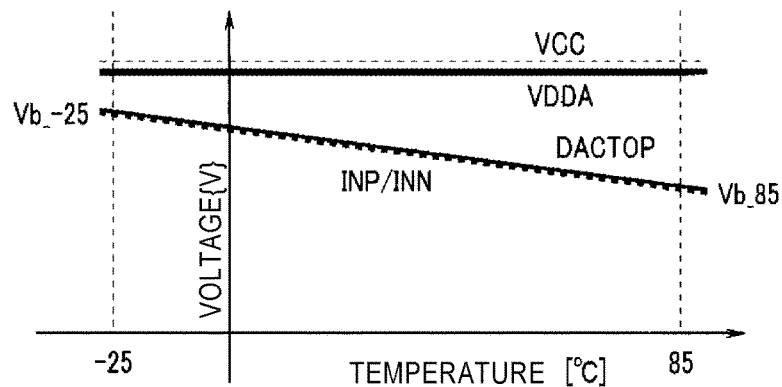
FIG. 11 is a graph illustrating changes in the voltage DACTOP, the temperature-proportional voltage Vt, and voltages VCC and VDDA with respect to the temperature changes, taking the temperature on the horizontal axis and the voltage on the vertical axis.
Figure 12:
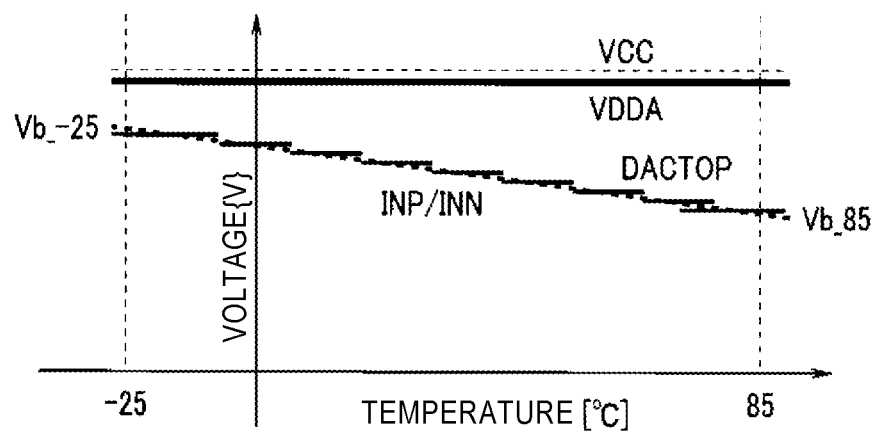
FIG. 12 is a graph illustrating changes in the voltage DACTOP, the temperature-proportional voltage Vt, and voltage VCC and VDDA with respect to the temperature changes, taking the temperature on the horizontal axis and the voltage on the vertical axis.
Figure 13:
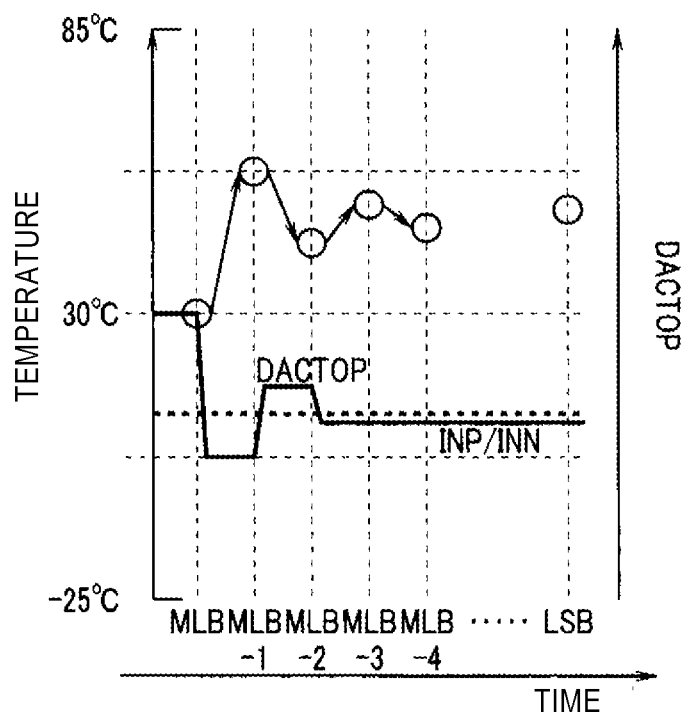
FIG. 13 is a diagram illustrating a control of the voltage DACTOP at the time of temperature detection, taking each bit of an output code on the horizontal axis and the temperature on the vertical axis.
Figure 14:
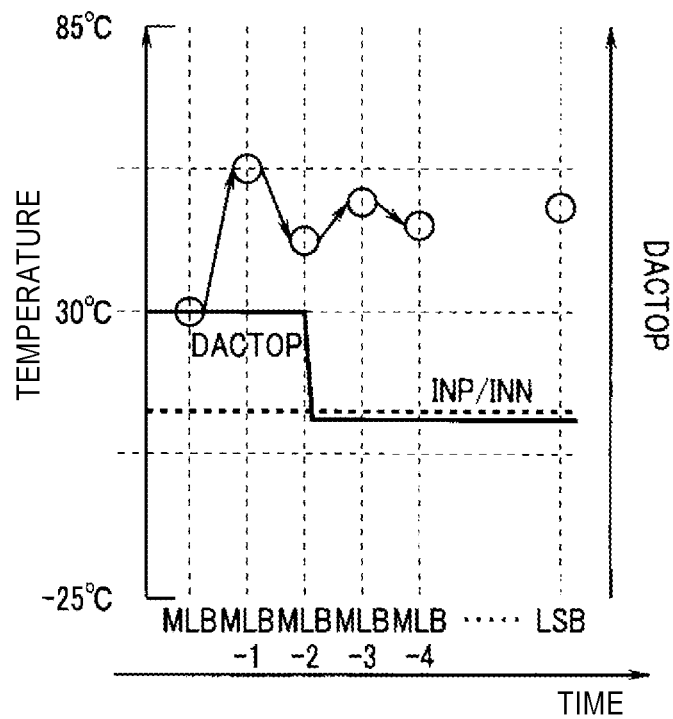
FIG. 14 is a diagram illustrating another control example of the voltage DACTOP at the time of temperature detection, taking each bit of the output code on the horizontal axis and taking the temperature on the vertical axis.
Figure 15:
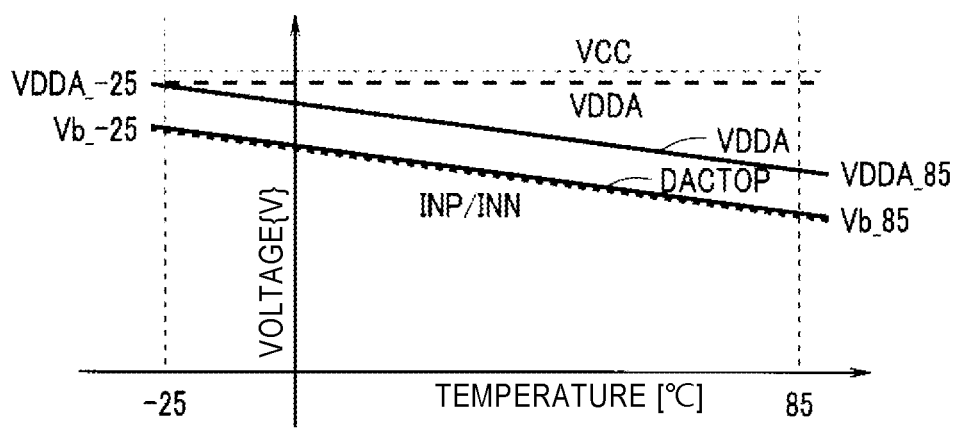
FIG. 15 is a graph illustrating an example when a control for a regulator 2 is applied in the example of FIG. 11.

Next, the operation of the embodiment configured in this way will be described with reference to FIGS. 11 to 15. FIGS. 11 and 12 are graphs illustrating changes in the voltage DACTOP, the voltage IN (INP/INN), and the voltage VCC and VDDA with respect to temperature changes, taking the temperature on the horizontal axis and the voltage on the vertical axis. Also, FIG. 11 represents the ideal control of the voltage DACTOP. Further, FIGS. 11 and 12 represent an example in which the control for the regulator 2 is omitted and only the control for the analog BGR circuit 3 is performed. FIG. 13 is a diagram illustrating the control of the voltage DACTOP at the time of temperature detection, taking each bit of an output code on the horizontal axis and the temperature on the vertical axis. FIG. 14 is a diagram illustrating another control example of the voltage DACTOP at the time of temperature detection, taking each bit of the output code on the horizontal axis and the temperature on the vertical axis. FIG. 15 is a graph illustrating an example when a control for the regulator 2 is applied in the example of FIG. 11.

In FIG. 15, for comparison, the voltage VDDA when the control for the regulator 2 is not applied is indicated by a broken line, and the voltage VDDA when the control for the regulator 2 is applied is indicated by a solid line.

The description will be continued by referring back to FIGS. 3A and 4A. The regulator 2 is given a voltage VCC to generate a voltage VDDA. The voltage VDDA is supplied to the analog BGR circuit 3 and the SARADC 4 in the BGR sensor unit 6. The analog BGR circuit 3 is different from the analog BGR circuit 13 of the comparative example in the voltage value of the generated voltage DACTOP. The operation of the analog BGR circuit 3 with respect to the temperature-proportional voltage Vt and the reference voltage DAC is the same as that of the analog BGR circuit 13. That is, the voltages of the nodes INN and INP become the same voltage (voltage IN) by the amplifier 31. Further, by the current mirror circuit 32, the current flowing through the drain/source path and the node INN of the transistors Q3 and Q4 and the current flowing through the drain/source path and the node INP of the transistors Q5 and Q6 are the same current I.

Both the current flowing through the emitter/collector path of the transistor Q1 and the current flowing through the emitter/collector path of the transistor Q2 have a positive temperature characteristic. The voltage at both ends of the resistor R1 is used as the temperature-proportional voltage Vt having a positive temperature characteristic. Meanwhile, both the current flowing through the resistor R6 and the current flowing through the resistor R7 have a negative temperature characteristic. Therefore, by appropriately setting the resistance values of the resistors R1, R6, and R7, the current I flowing through the node INN (INP) may be set to a temperature-independent current.

The current mirror circuit 32 causes, for example, a mirror current Iout that matches the current I flowing through the node INN (INP) to flow through the drain/source path of the transistors Q7 and Q8. The mirror current Iout flows to the reference potential point via the resistance circuit 33 and the resistor R2. The analog BGR circuit 3 supplies a voltage generated by the mirror current Iout flowing through the resistor R2 to the SARADC 4 as a reference voltage DAC.

The SARADC 4 uses the reference voltage DAC to generate an output code corresponding to the temperature-proportional voltage Vt, and outputs the generated output code as temperature information.

In this case, in the present embodiment, the voltage DACTOP is changed according to the temperature information, and the voltage DACTOP is controlled to match the voltage IN. FIG. 11 illustrates this control. As illustrated in FIG. 11, the voltage IN (broken line), which is the voltage of the nodes INN and INP, has a negative temperature characteristic. The temperature information from the SARADC 4 is fed back to the resistance circuit 33 in the analog BGR circuit 3 via the setting control circuit 5. The setting control circuit 5 changes the resistance value of the resistance circuit 33 according to the temperature information. That is, the setting control circuit 5 lowers the resistance value of the resistance circuit 33 as the temperature rises, and raises the resistance value as the temperature decreases. The resistance value of the resistance circuit 33 changes so that the change in the resistance value of the resistance circuit 33 with respect to the temperature change becomes the temperature characteristic corresponding to the temperature characteristic of the node INN (INP).

The voltage DACTOP is obtained by the resistance value of the sum of the resistance value of the resistor R2 and the resistance value of the resistance circuit 33, and the mirror current Iout. The resistance circuit 33 imparts a negative temperature characteristic to the voltage DACTOP by appropriately changing the resistance value of the resistance circuit 33 using the temperature information, and causes the voltage DACTOP to match the voltage IN, as illustrated by the solid line in FIG. 11.

As a result of the voltage DACTOP matching the voltage IN, the mirror current Iout matches the current I flowing through the node INN (INP). Thus, the mirror current Iout becomes a temperature-independent constant current, and the reference voltage DAC also becomes a temperature-independent constant voltage. Therefore, in the present embodiment, the temperature may be detected with high accuracy.

Further, in order to enable the control of FIG. 11, it is necessary to make a resolution of the resistance value of the resistance circuit 33 extremely high, and the mounting is not easy. Therefore, it is conceivable to limit the resolution of the resistance circuit 33. FIG. 12 represents the control of the voltage DACTOP in this case. In this case, by changing the resistance value of the resistance circuit 33 stepwise, as illustrated in FIG. 12, the voltage DACTOP may be changed stepwise with respect to the temperature change. Even in this case, a temperature detection with sufficiently high accuracy may be made in actual use.

The SARADC 4 uses the voltage DAC at the time of measuring the temperature, and the analog BGR circuit 3 controls the voltage DACTOP according to the control signal from the setting control circuit 5, that is, according to the temperature information. Therefore, the accuracy of the output code first output from the SARADC 4 is not necessarily high. That is, in order to enable the highly accurate temperature detection by controlling the voltage DACTOP using the temperature information from the SARADC 4, plural temperature detections are required.

Therefore, in the present embodiment, a highly accurate temperature detection result may be obtained by a single temperature detection by using the measurement result obtained during the A/D conversion of the SARADC 4. The output code output by the SARADC 4 is a digital code whose value changes in proportion to the detected temperature, and the MSB value corresponds to an intermediate temperature of the operating temperature range. The SARADC 4 first obtains the MSB value of the output code. As illustrated in FIG. 9, at an intermediate temperature of the operating temperature range, the voltage DACTOP becomes a voltage value near the voltage IN, and the voltage DACTOP becomes a voltage value separated from the voltage IN at both ends of the operating temperature range. Therefore, when the SARADC 4 obtains the MSB value, and when the temperature-proportional voltage Vt is a voltage corresponding to a temperature near an intermediate temperature of the operating temperature range, since the voltage DAC is a voltage near the specified voltage that needs to be originally set, it is unlikely that the SARADC 4 erroneously determines the MSB value. Further, when the temperature-proportional voltage Vt is the temperature at both ends of the operating temperature range, even when the voltage DAC fluctuates slightly from the voltage that needs to be originally set, it is unlikely that the MSB value corresponding to the intermediate temperature of the operating temperature range is erroneously determined.

In the example of FIG. 13, MSB "1" is obtained by a first determination of the SARADC 4. The detected temperature in the example of FIG. 13 is a voltage between the middle and upper limits of the operating temperature range, and the voltage DACTOP is higher than the voltage IN in the initial state. The SARADC 4 gives, to the setting control circuit 5, the temperature information of an intermediate result of the temperature detection indicating that the MSB is "1". The setting control circuit 5 controls the resistance circuit 33 of the analog BGR circuit 3 based on this temperature information. As a result, the resistance circuit 33 is reduced to a resistance value corresponding to the temperature information indicating that the supplied MSB is "1". In this case, the resistance value of the resistance circuit 33 changes so that the voltage DACTOP drops by, for example, ¼ of the change in the voltage DACTOP in the operating temperature range of FIG. 9. As a result, as illustrated in FIG. 13, the voltage DACTOP becomes lower than the voltage IN, and the difference becomes relatively smaller. Therefore, the mirror current Iout approaches the current I flowing through the nodes INN and INP, and the voltage DAC approaches the voltage that needs to be originally set.

The SARADC 4 determines the next bit after the voltage DACTOP and the voltage DAC have been changed. That is, the SARADC 4 sets the reference voltage to DAC+DAC/2 using the voltage DAC changed in a second determination, and obtains the bit value of MLB-1. In the example of FIG. 13, the SARADC 4 obtains "0" as the bit value of the bit of MSB-1. The SARADC 4 gives the temperature information of the intermediate result of the temperature detection indicating that the bit of the MSB-1 is "0" to the setting control circuit 5. The setting control circuit 5 controls the resistance circuit 33 of the analog BGR circuit 3 based on this temperature information. The resistance circuit 33 increases the resistance value according to the temperature information indicating that the supplied MSB is "0". In this case, the resistance value of the resistance circuit 33 changes so that the voltage DACTOP increases by, for example, ⅛ of the change in the voltage DACTOP in the operating temperature range of FIG. 9. As a result, as illustrated in FIG. 13, the voltage DACTOP becomes larger than the voltage IN.

The SARADC 4 sets the reference voltage to DAC+DAC/2−DAC/4 using the voltage DAC changed in a third determination, and obtains the bit value of MLB-2. In the example of FIG. 13, the SARADC 4 obtains "1" as the bit value of the MSB-2 bit. The SARADC 4 gives the temperature information of the intermediate result of the temperature detection indicating that the bit of the MSB-2 is "1" to the setting control circuit 5. The setting control circuit 5 controls the resistance circuit 33 of the analog BGR circuit 3 based on this temperature information. The resistance circuit 33 decreases to a resistance value according to the temperature information indicating that the supplied MSB is "1". In this case, the resistance value of the resistance circuit 33 changes so that the voltage DACTOP increases by, for example, ¹⁄₁₆ of the change in the voltage DACTOP in the operating temperature range of FIG. 9. As a result, as illustrated in FIG. 13, the voltage DACTOP becomes a voltage equivalent to substantially the voltage IN.

Thereafter, the same operation is repeated. Therefore, after that, the voltage DAC becomes the voltage that needs to be originally set, and the SARADC 4 may output the temperature detection result with high accuracy.

In this way, the voltage DACTOP gradually converges to the voltage IN each time the bit value of each bit of the SARADC 4 is determined. When the voltage DACTOP matches the voltage IN at the time when the LSB value of the output code is determined, since high temperature detection accuracy is obtained, a high-precision temperature detection may be reliably performed by executing the process illustrated in FIG. 13.

Further, the voltage DACTOP may be controlled up to the LSB bit. However, it may be considered that sufficient temperature detection accuracy is obtained when the difference between the voltage DACTOP and the voltage IN is within a predetermined threshold value, that is, when the voltage DAC is within a predetermined threshold value with respect to the specified voltage that needs to be originally set. Therefore, when the difference between the voltage DACTOP and the voltage IN is within a predetermined threshold value, the control of the voltage DACTOP may be stopped. FIG. 13 illustrates this state.

Further, in the example of FIG. 13, descriptions have been made on an example in which the voltage DACTOP is continuously controlled from the output of the first bit (MSB) value of the temperature information during detection. However, in this way, the voltage DACTOP may be continuously controlled each time a bit value is obtained from the SARADC 4, or the voltage DACTOP may be controlled intermittently. In addition, the voltage DACTOP may be controlled continuously, intermittently, or only once from the output of the bit value in the middle of the temperature information during detection. The voltage DACTOP may be controlled by using only the bit value of the bit immediately before the last bit (LSB) of the temperature information during detection.

It is possible to detect the temperature with higher accuracy by controlling the voltage DACTOP by using the output of the bit value on the LSB side. However, when the control of the voltage DACTOP using the bit value on the MSB side is not performed, a relatively large error may occur in the temperature detection result. Therefore, the voltage DACTOP control may be performed plural times using the bit value on the MSB side, the intermediate bit value, and the LSB bit value, and ideally, such a control may be performed each time as illustrated in FIG. 13. Further, the bit for performing the voltage DACTOP control may be determined according to the range of the detected temperature.

As described above, when the difference between the voltage DACTOP and the voltage IN is within a predetermined threshold value, sufficient temperature detection accuracy may be obtained. For example, by controlling the voltage DACTOP for each determination of the upper few bits of the output code, it is conceivable that the difference between the voltage DACTOP and the voltage IN is within a predetermined threshold value. Therefore, for example, the number of upper bits for controlling the voltage DACTOP may be determined in advance, and the number of bits may be set by the CPU in the memory controller 62. The CPU of the memory controller 62 may set an appropriate number of bits according to its own system, and may perform an optimum control for the system.

FIG. 14 represents an example in which the voltage DACTOP is controlled by the MLB-2 bit and the control of the voltage DACTOP is stopped when the difference between the voltage DACTOP and the voltage IN is within a predetermined threshold value. Even in this case, when there is no error in the determination from MLB to MBB-2, a highly accurate temperature detection result may be obtained.

Further, in the present embodiment, the voltage VDDA is also controlled by using the temperature information. As described above, the voltage VDDA is set so that the difference from the voltage IN at the lowest operating temperature becomes larger than a predetermined value due to the limitation of the temperature detection accuracy. As a result, as illustrated in FIGS. 11 and 12, the difference between the voltage VCC and the voltage VDDA becomes relatively small, and the PSRR deteriorates. Therefore, in the present embodiment, in order to prevent the deterioration of the PSRR, the voltage VDDA is also changed according to the change of the voltage IN.

A control signal based on temperature information is given to the resistance circuit 22 from the setting control circuit 5. The resistance circuit 22 changes the resistance value according to the temperature information, and changes the feedback voltage obtained by the resistance voltage division of the voltage VDDA appearing in the drain of the transistor DRV. That is, in the resistance circuit 22, as the temperature indicated by the temperature information becomes higher, the feedback voltage obtained by the resistance voltage division becomes smaller, and as such a temperature becomes lower, the feedback voltage obtained by the resistance voltage divider becomes larger. The resistance circuit 22 feeds back the voltage obtained by the resistance voltage division to the positive electrode terminal of the amplifier 21.

As a result, as the detection temperature becomes lower, the voltage VDDA becomes higher, and as the detection temperature becomes higher, the voltage VDDA becomes lower. In this way, as illustrated in FIG. 15, a voltage difference from the voltage IN, for example, a constant voltage VDDA is output from the regulator 2. In the example of FIG. 15, the difference voltage between the voltage VCC and the voltage VDDA is the smallest at the lowest operating temperature and increases as the operating temperature increases. As a result, the deterioration of PSRR at the lowest operating temperature may not be prevented, but the difference between the voltage VCC and the voltage VDDA may be increased as the operating temperature increases, and the PSSR other than low temperature may be sufficiently improved. Depending on the system, there are many applications that require a high-precision detection at high temperatures, and the effect of improving the PSSR by the present embodiment is great.

As for the control of the voltage VDDA, as in the control of the voltage DACTOP, the control may be performed using the final temperature detection result, or may be performed using the temperature information during the detection. Further, the voltage VDDA may be continuously controlled from the output of the first bit (MSB) value of the temperature information during detection, or the voltage DACTOP may be controlled intermittently. The voltage VDDA may be controlled continuously, intermittently, or only once from the output of the bit value in the middle of the temperature information during detection, and the voltage VDDA may be controlled by using only the bit value of the bit immediately before the last bit (LSB) of the temperature information during detection. As for the control of the voltage VDDA, as in the control of the voltage DACTOP, for example, the number of upper bits for controlling the voltage VDDA may be determined in advance, and the number of bits may be set by the CPU in the memory controller 62.

As described above, in the present embodiment, the voltage DACTOP is matched with the voltage IN by using the temperature information, and the mirror current Iout corresponding with the current I flowing through the nodes INN and INP is generated. As a result, the voltage DAC may be controlled to a specified voltage that needs to be originally set regardless of the temperature change, and a highly accurate temperature detection result may be obtained in the entire operating range. Further, the voltage VDDA is controlled based on the temperature information, and the PSSR may be improved as the operating temperature becomes higher than the lowest operating temperature.

Second Embodiment

Figure 16:
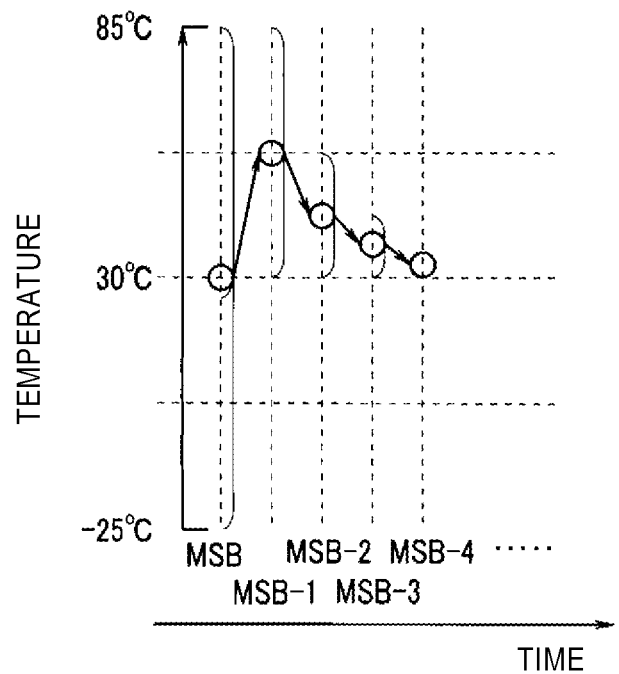
FIG. 16 is a diagram illustrating the control adopted in a second embodiment.
Figure 17:
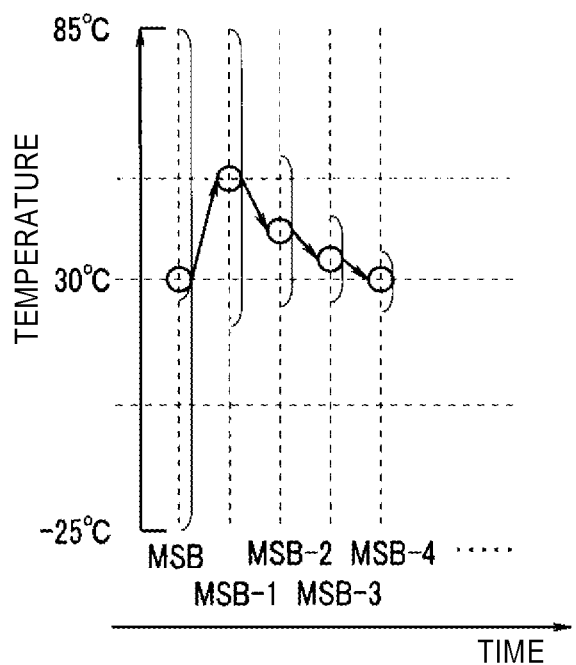
FIG. 17 is a diagram illustrating the control adopted in the second embodiment.

FIGS. 16 and 17 are diagrams illustrating the control adopted in a second embodiment. The hardware configuration in the present embodiment is the same as that in the first embodiment. FIGS. 16 and 17 are diagrams illustrating a method of determining each bit of the SARADC 4, taking each bit of the output code on the horizontal axis and the temperature on the vertical axis. FIG. 16 illustrates a method of determining the SARADC 4 in the first embodiment, and FIG. 17 illustrates a method of determining the SARADC 4 in the second embodiment.

In the first embodiment, the voltage DAC fluctuates slightly until the voltage DACTOP matches the voltage IN. For example, when the voltage DACTOP is controlled from a bit in the middle of the output code as in the example of FIG. 14, it is considered that the difference between the voltage DACTOP and the voltage IN is relatively large before the control of the voltage DACTOP. In this case, the voltage DAC deviates relatively greatly from the voltage that needs to be originally set, and there is a possibility that an error occurs in the bit value determined by the SARADC 4. Therefore, in the present embodiment, a circuit having redundancy is adopted as the In the examples of FIGS. 16 and 17, each reference voltage at the time of determination from MSB to MSB-4 on the upper side of the output code is indicated by a circle, and the determination temperature range using each reference voltage is indicated by parentheses. The SARADC 4 uses the reference voltage obtained by adding or subtracting the reference voltage of ½, ¼, . . . to/from the reference voltage used in the previous determination according to the determination result of each bit for the next determination. In this case, the SARADC 4 of the first embodiment determines a temperature range other than the temperature range excluded by the previous determination. That is, the SARADC 4 determines the bit value of each bit by setting the temperature range excluding the temperature range excluded from the detection temperature by the previous determination result among the temperature detection ranges in the previous determination as the determination target.

However, when there is an error in the previous determination, for example, when the MSB bit value is determined to be "1" for a temperature lower than 30° C. in FIG. 16, an error is confirmed and the temperature detection error is large.

The SARADC 4 of the present embodiment includes a predetermined temperature range adjacent to the current determination temperature range in the determination temperature range among the temperature ranges excluded by the determination up to the previous time. Therefore, for example, even when the MSB bit value is determined to be "1" for a temperature lower than 30° C. in FIG. 17, the temperature detected at the time of the next determination of the MSB-1 bit may be included in the determination temperature range, and the correct temperature may be detected in the determination of the MSB-1 bit. Further, in this case, the SARADC 4 changes the bit value of the MSB bit from "1" to "0".

As described above, in the present embodiment, by adopting a circuit having redundancy as the SARADC 4, it is possible to correct an error during the temperature detection in the SARADC 4 and detect the temperature with higher accuracy.

Third Embodiment

Figure 18:
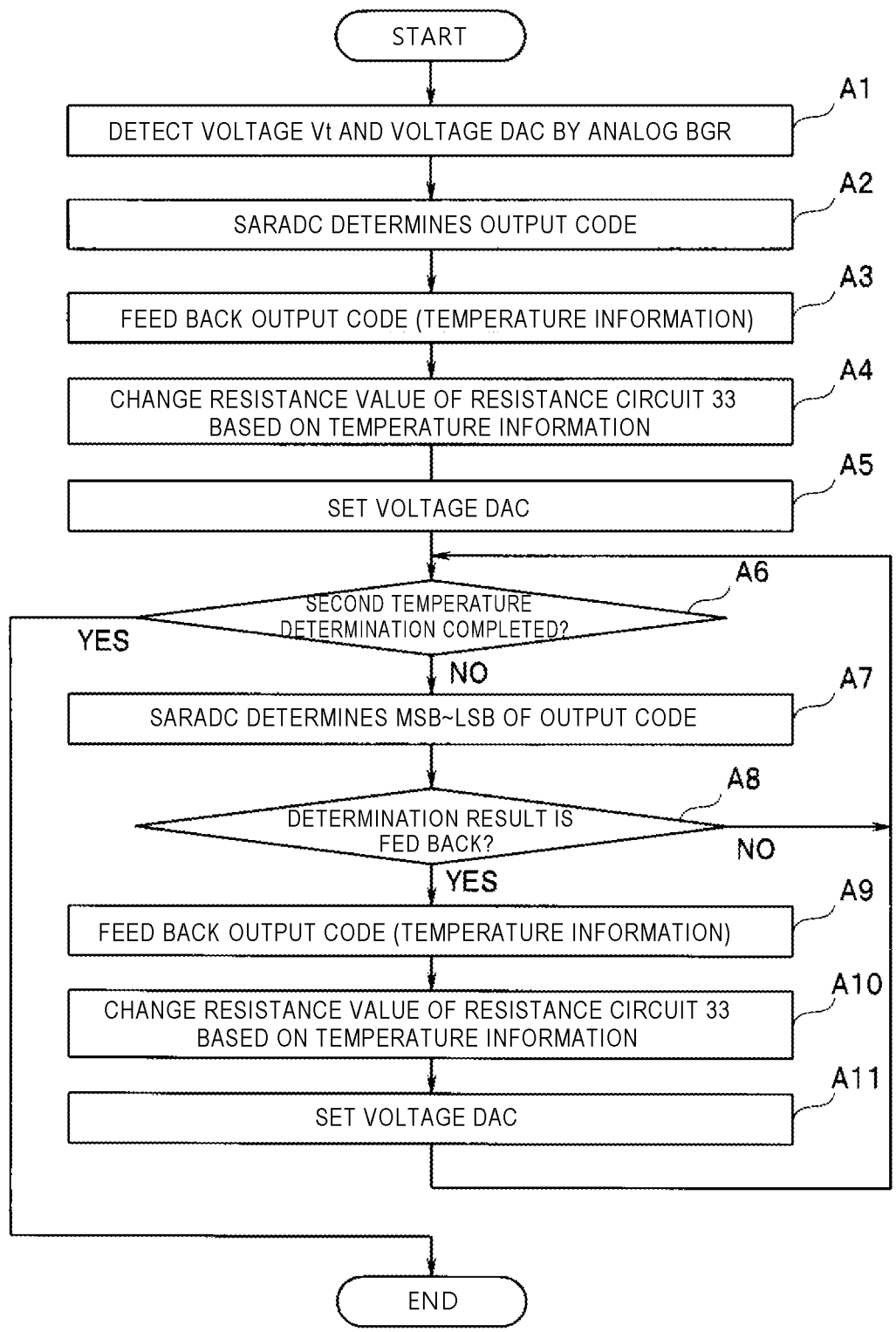
FIG. 18 is a flowchart of the control adopted in a third embodiment.

FIG. 18 is a flowchart of the control adopted in a third embodiment. The hardware configuration in the present embodiment is the same as that in the first embodiment.

In each of the above embodiments, an example of changing the voltage DACTOP by using the temperature information during the detection of the output code has been described. However, it is conceivable that it takes a relatively long time to change the voltage DACTOP, supply a new voltage DAC to the SARADC 4, and set a reference voltage based on the new voltage DAC in the SARADC 4. In this case, the overall time required for temperature detection becomes longer. Therefore, in the present disclosure, the above-described embodiment is applied in a state where the temperature is obtained with low accuracy without controlling the voltage DACTOP in the first time, and the voltage DACTOP corresponding to the obtained temperature in the second time is first set. Thus, the time for the voltage DACTOP to converge to the voltage IN may be shortened, and as a result, the speed of temperature detection may be improved. Although only the control of the voltage DACTOP has been described with reference to FIG. 18, the control of the voltage VDDA may be performed in the same manner.

Steps A1 and A2 in FIG. 18 represent a first temperature detection process. First, the temperature-proportional voltage Vt and the voltage DAC are detected by the analog BGR circuit 3. The temperature-proportional voltage Vt and the voltage DAC are supplied to the SARADC 4, and the SARADC 4 determines each bit of the output code according to the temperature-proportional voltage Vt using the voltage DAC (A2). That is, in the first temperature detection process, the voltage DACTOP is not controlled by the temperature information. Therefore, the temperature detection accuracy is relatively low, while the process is performed at relatively high speed.

Next, the temperature information obtained by the first temperature detection process is fed back to the analog BGR circuit 3 (A3). The resistance circuit 33 changes the resistance value based on the temperature information (A4). As a result, the voltage DACTOP changes, and the voltage DAC from the analog BGR circuit 3 also changes. This voltage DAC is set to the SARADC 4 (A5). The SARADC 4 generates a reference voltage based on the set voltage DAC, and when a second temperature determination is not completed ("NO" in A6), each bit of the output code is obtained (A7). When it is necessary to feed back the obtained bit value ("YES" in A8), the SARADC 4 shifts the process to step A9 and, when it is not necessary to feed back ("NO" in A8), the SARADC 4 shifts the process to step A6.

In step A9, the SARADC 4 feeds back the obtained bit value (temperature information) to the analog BGR circuit 3 via the setting control circuit 5. The resistance circuit 33 changes the resistance value based on the temperature information (A10). As a result, the voltage DACTOP changes, and the voltage DAC from the analog BGR circuit 3 also changes. This voltage DAC is set to the SARADC 4 (A11). The SARADC 4 generates a reference voltage based on the set voltage DAC, and when the second temperature determination is not completed ("NO" in A6), the next bit of the output code is obtained (A7). Thereafter, the same operation is repeated, and when the LSB bit value of the output code is obtained ("YES" in A6), the process ends.

At the time of the second temperature detection, the voltage DACTOP converges to the voltage IN relatively quickly, and it is determined in step A8 that feedback is unnecessary at a relatively early stage. As a result, the time for the second temperature detection process may be significantly shortened.

As described above, in the present embodiment, the voltage DACTOP and the voltage DAC at the time of calculating the first bit value of the second time are detected by using the temperature information obtained in the first time. At the time of calculating the first bit value for the second time, the voltage DACTOP is a voltage near the voltage IN, and the voltage DACTOP converges to the voltage IN in a relatively short time. Thus, the control of the voltage DACTOP may be completed in a short time, and as a result, the time required for temperature detection may be shortened.

Further, in the third embodiment, descriptions have been made on an example in which the temperature is detected without controlling the voltage DACTOP for the first time and the temperature is detected while controlling the voltage DACTOP for the second time. However, when the operating temperature is known to a certain extent in advance, it is possible to omit the first temperature detection process by storing the temperature information in a memory and giving the temperature information from this memory to the analog BGR circuit 3.

Modification

Figure 19:
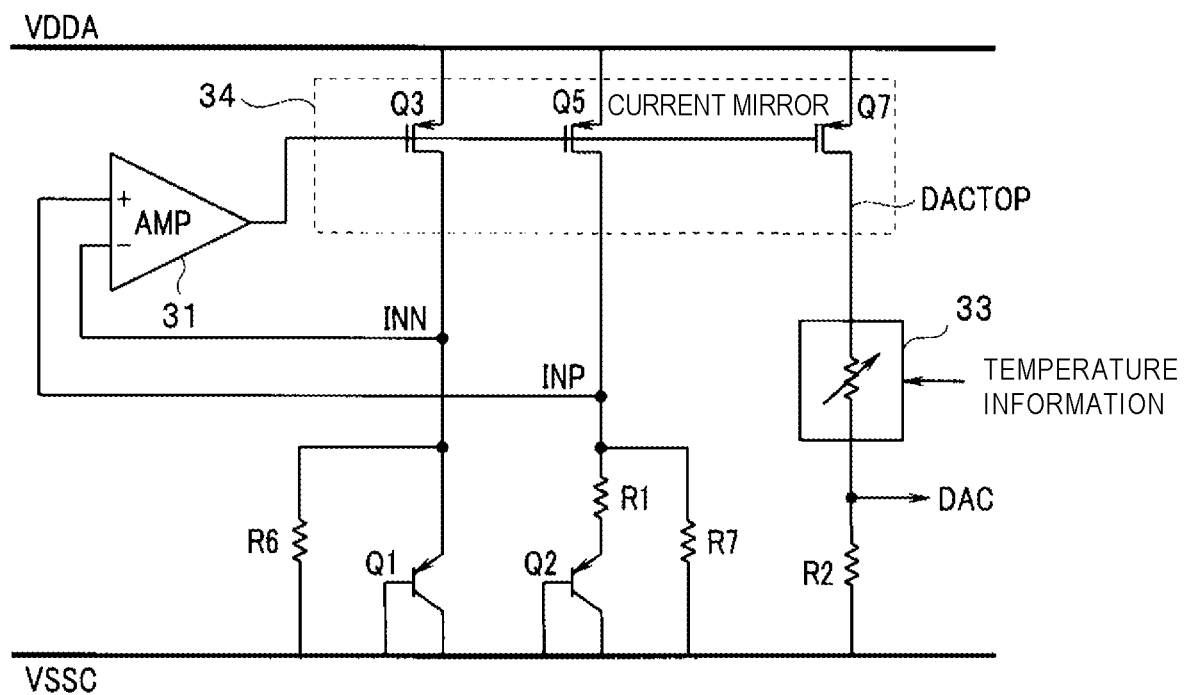
FIG. 19 is a circuit diagram illustrating a modification of a BGR circuit.

FIG. 19 is a circuit diagram illustrating a modification of the analog BGR circuit. The modification is different from the analog BGR circuit 3 of FIG. 4A in that the current mirror circuit 34 using the one-stage transistors Q3, Q5, and Q7 is adopted instead of the current mirror circuit 32 using the cascode-connected transistors Q3 to Q8.

Also in this case, the same effect as that of each of the above-described embodiments may be obtained.

In each of the above embodiments, descriptions have been made on an example in which the regulator 2 and the analog BGR circuit 3 use the output code which is the temperature information, but it is also possible to use the output code in a circuit block other than these circuits. For example, in the circuit of the temperature sensor, an optimization process using the output code may be performed on the circuit portion whose characteristics change depending on the temperature. For example, it is conceivable to optimize the switch size of the AD converter by using the output code.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
   a bandgap reference circuit that includes a first bandgap element, a second bandgap element, and a current mirror circuit, the bandgap reference circuit configured to generate a temperature-dependent first voltage and a temperature-independent reference voltage;
   an analog-to-digital converter configured to convert the first voltage into an output code based on the reference voltage and output the first voltage as temperature information;
   a regulator configured to supply a power supply voltage to the bandgap reference circuit; and
   a setting control circuit configured to change a resistance value of the bandgap reference circuit and the regulator based on the temperature information,
   wherein the temperature information is an intermediate result which is output from the analog-to-digital converter during detection operation.

2. The semiconductor integrated circuit according to claim 1, wherein the analog-to-digital converter is a sequential comparison type, and the control setting circuit is configured to change the setting of the bandgap reference circuit using the temperature information concurrently with the analog-to-digital converter converting the first voltage into the output code.

3. The semiconductor integrated circuit according to claim 2, wherein the control setting circuit is configured to change the setting using the temperature information each time the analog-to-digital converter obtains each bit of the output code.

4. The semiconductor integrated circuit according to claim 3, wherein the control setting circuit is configured to change the setting using the temperature information each time one or more predetermined bits of the output code are obtained.

5. The semiconductor integrated circuit according to claim 4, wherein the control setting circuit is configured to stop changing the setting when a difference between the reference voltage and a specified voltage falls within a predetermined threshold value.

6. The semiconductor integrated circuit according to claim 1,
   wherein the bandgap reference circuit includes:
   a first current path configured to conduct a current through the first bandgap element;
   a second current path configured to conduct a current through the second bandgap element;
   a first transistor that constitutes at least a portion of the current mirror circuit and is configured to conduct a current through the first current path;
   a second transistor that constitutes at least a portion of the current mirror circuit and is configured to conduct a current through the second current path;
   a third transistor that constitutes at least a portion of the current mirror circuit and is configured to conduct a current through a third current path;
   a resistor provided on the third current path and configured to generate the reference voltage; and
   a resistance circuit provided on the third current path and configured to set a terminal voltage of the third transistor, and
   the control setting circuit is configured to change a resistance value of the resistance circuit based on the temperature information.

7. The semiconductor integrated circuit according to claim 6, wherein the control setting circuit is configured to change the resistance value of the resistance circuit so that the terminal voltage of the third transistor matches terminal voltages of the first and second transistors.

8. The semiconductor integrated circuit according to claim 7,
   wherein the control setting circuit is configured to stop changing the setting when a difference between the reference voltage and a specified voltage falls within a predetermined threshold value so that the terminal voltage of the third transistor matches the terminal voltages of the first and second transistors.

9. The semiconductor integrated circuit according to claim 1,
   wherein the control setting circuit is configured to omit changing the setting at a time of a first temperature measurement, and change the setting at a time of a second temperature measurement.

10. The semiconductor integrated circuit according to claim 1, wherein the current mirror circuit includes a transistor having a one-stage configuration or cascode connection.

11. The semiconductor integrated circuit according to claim 1,
    wherein the analog-to-digital converter is a sequential comparison type, and
    the setting control circuit is configured to change the setting of the regulator using the temperature information concurrently with the analog-to-digital converter converting the first voltage into the output code.

12. A semiconductor integrated circuit comprising:
    a bandgap reference circuit that includes bandgap elements and a current mirror circuit and is configured to generate a temperature-dependent first voltage and a temperature-independent reference voltage;
    an analog-to-digital converter configured to convert the first voltage into an output code using the reference voltage and output the first voltage as temperature information;
    a regulator configured to supply a power supply voltage to the bandgap reference circuit; and
    a setting control circuit configured to change at least one setting of the regulator based on the temperature information, and change the setting of the regulator using the temperature information concurrently with the analog-to-digital converter converting the first voltage into the output code.

13. The semiconductor integrated circuit according to claim 1, wherein the first and second bandgap elements are each a bipolar junction transistor.

14. The semiconductor integrated circuit according to claim 12, wherein the analog-to-digital converter is a sequential comparison type.

15. A method, comprising:
- generating a temperature-dependent first voltage and a temperature-independent reference voltage;
- converting the first voltage into an output code based on the reference voltage to output temperature information;
- changing at least one setting of a bandgap reference circuit based on the temperature information; and
- changing a setting of a regulator configured to supply a power supply voltage using the temperature information concurrently with converting the first voltage into the output code.

16. The method of claim 15, wherein the bandgap reference circuit includes:
- a first current path configured to conduct a current through a first bandgap element;
- a second current path configured to conduct a current through a second bandgap element;
- a first transistor configured to conduct a current through the first current path;
- a second transistor configured to conduct a current through the second current path;
- a third transistor configured to conduct a current through a third current path;
- a resistor provided on the third current path and configured to generate the reference voltage; and
- a resistance circuit provided on the third current path and configured to set a terminal voltage of the third transistor.

17. The method of claim 16, wherein the step of changing a setting of a bandgap reference circuit further comprises:
- changing a resistance value of the resistance circuit based on the temperature information.

* * * * *